(12) United States Patent
Xie et al.

(10) Patent No.: US 11,132,934 B2
(45) Date of Patent: Sep. 28, 2021

(54) SHIFT REGISTER UNIT COMPRISING INPUT CIRCUIT, OUTPUT CIRCUIT, AND FIRST NODE CONTROL CIRCUIT, GATE DRIVING CIRCUIT, DISPLAY DEVICE, AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Yongxian Xie, Beijing (CN); Jinliang Liu, Beijing (CN); Hui Wang, Beijing (CN); Miao Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/641,737

(22) PCT Filed: Aug. 16, 2019

(86) PCT No.: PCT/CN2019/101103
§ 371 (c)(1),
(2) Date: Feb. 25, 2020

(87) PCT Pub. No.: WO2020/048305
PCT Pub. Date: Mar. 12, 2020

(65) Prior Publication Data
US 2021/0150969 A1    May 20, 2021

(30) Foreign Application Priority Data

Sep. 6, 2018   (CN) .......................... 201811038779.0

(51) Int. Cl.
*G09G 3/20*   (2006.01)

(52) U.S. Cl.
CPC ... *G09G 3/2092* (2013.01); *G09G 2310/0243* (2013.01); *G09G 2310/0286* (2013.01)

(58) Field of Classification Search
CPC ............... G09G 3/2092; G09G 3/3266; G09G 3/3674–3681; G09G 2300/0809;
(Continued)

(56) References Cited

U.S. PATENT DOCUMENTS 9,524,686 B2   12/2016   Zhang et al.
9,916,807 B2    3/2018   Kim et al.
(Continued)

FOREIGN PATENT DOCUMENTS

CN    104036738 A    9/2014
CN    105702194 A    6/2016
(Continued)

OTHER PUBLICATIONS

Mar. 2, 2021—(CN) First Office Action Appn 201811038779.0 with English Translation.

*Primary Examiner* — Nathan Danielsen
(74) *Attorney, Agent, or Firm* — Banner & Witcott, Ltd.

(57) ABSTRACT

A shift register unit, a gate driving circuit, a display device, and a driving method are provided. The shift register unit includes an input circuit, an output circuit, and a first node control circuit. The input circuit is configured to charge a first node in response to an input signal; the output circuit is configured to output an output signal at an output terminal under control of a level signal of the first node; and the first node control circuit is configured to receive a precharge control signal from a precharge control terminal and charge the first node in response to the precharge control signal before the output terminal outputs the output signal.

15 Claims, 7 Drawing Sheets

(58) Field of Classification Search
CPC .............................. G09G 2310/02–0221; G09G 2310/0243–0251; G09G 2310/0267; G09G 2310/0278; G09G 2310/0286
See application file for complete search history.

(56) References Cited

U.S. PATENT DOCUMENTS

| | | |
|---|---|---|
| 10,096,372 B2 | 10/2018 | Chan |
| 10,217,391 B2 | 2/2019 | Shang et al. |
| 2010/0177068 A1 | 7/2010 | Shih et al. |
| 2012/0188213 A1* | 7/2012 | Nam .................... G09G 3/3614 345/208 |
| 2016/0210925 A1* | 7/2016 | Chung ................. G09G 3/3266 |
| 2017/0076680 A1* | 3/2017 | Li ............................ G09G 3/20 |

FOREIGN PATENT DOCUMENTS

| | | | |
|---|---|---|---|
| CN | 205428461 U | 8/2016 | |
| CN | 106297624 A | 1/2017 | |
| EP | 3125230 A1 * | 2/2017 | ........... G09G 3/3648 |
| KR | 101568258 B1 | 11/2015 | |

* cited by examiner

SHIFT REGISTER UNIT COMPRISING INPUT CIRCUIT, OUTPUT CIRCUIT, AND FIRST NODE CONTROL CIRCUIT, GATE DRIVING CIRCUIT, DISPLAY DEVICE, AND DRIVING METHOD

The application is a U.S. National Phase Entry of International Application No. PCT/CN2019/101103 filed on Aug. 16, 2019, designating the United States of America and claiming priority to Chinese Patent Application No. 201811038779.0, filed on Sep. 6, 2018. The present application claims priority to and the benefit of the above-identified applications and the above-identified applications are incorporated by reference herein in their entirety.

TECHNICAL FIELD

The embodiments of the present disclosure relate to a shift register unit, a gate driving circuit, a display device, and a driving method.

BACKGROUND

In a field of display technology, for example, a pixel array of a liquid crystal display panel generally comprises a plurality of rows of gate lines and a plurality of columns of data lines, the plurality of rows of gate lines are interlaced with the plurality of columns of data lines. The driving of the gate lines can be achieved by a bonded integrated driving circuit. In recent years, with continuous improvement of a preparation process of amorphous silicon thin film transistors or oxide thin film transistors, the gate driving circuit can also be directly integrated on a thin film transistor array substrate to form a GOA (Gate driver On Array) to drive the gate lines. For example, a GOA including a plurality of cascaded shift register units may be used to provide on-off state voltage signals (scan signals) for the plurality of rows of gate lines of the pixel array, thereby, for example, controlling the plurality of rows of gate lines to be sequentially turned on, and at the same time, data signals are provided to pixel units in a corresponding row in the pixel array through the data lines, therefore, gray voltages required for respective gray scales of a display image in respective pixel units are generated, furthermore a frame of image is displayed. Currently, display panels increasingly adopt GOA technology to drive the gate lines. The GOA technology is conducive to achieving a narrow frame of the display panel and reducing production costs of the display panel.

SUMMARY

At least one embodiment of the present disclosure provides a shift register unit, and the shift register unit comprises an input circuit, an output circuit, and a first node control circuit. The input circuit is configured to charge a first node in response to an input signal; the output circuit is configured to output an output signal at an output terminal under control of a level signal of the first node; and the first node control circuit is configured to receive a precharge control signal from a precharge control terminal and charge the first node in response to the precharge control signal before the output terminal outputs the output signal.

For example, in the shift register unit provided by at least one embodiment of the present disclosure, the input circuit is connected to the first node, the output circuit comprises the output terminal, and the output circuit is connected to the first node, and the first node control circuit is connected to the first node and the precharge control terminal, respectively.

For example, the shift register unit provided by at least one embodiment of the present disclosure further comprises an output control circuit, the output control circuit is respectively connected to the output terminal and the precharge control terminal, and is configured to receive the precharge control signal from the precharge control terminal and to control the output terminal to be at an invalid output level during a non-output phase in response to the precharge control signal.

For example, in the shift register unit provided by at least one embodiment of the present disclosure, the first node control circuit comprises a first capacitor, a first electrode of the first capacitor is connected to the first node, and a second electrode of the first capacitor is connected to the precharge control terminal to receive the precharge control signal.

For example, in the shift register unit provided by at least one embodiment of the present disclosure, the output control circuit comprises a first transistor. A gate electrode of the first transistor is connected to the precharge control terminal to receive the precharge control signal, a first electrode of the first transistor is connected to the output terminal, and a second electrode of the first transistor is connected to a first voltage terminal to receive a first voltage.

For example, the shift register unit provided by at least one embodiment of the present disclosure further comprises a first node reset circuit. The first node reset circuit is connected to the first node and configured to reset the first node in response to a reset signal.

For example, the shift register unit provided by at least one embodiment of the present disclosure further comprises a second node control circuit, a first node noise reduction circuit, and an output noise reduction circuit. The second node control circuit is respectively connected to the first node and a second node, and is configured to control a level of the second node under control of the level signal of the first node; the first node noise reduction circuit is connected to the first node and the second node, and is configured to perform noise reduction on the first node under control of a level signal of the second node; and the output noise reduction circuit is connected to the second node and the output terminal, and is configured to perform noise reduction on the output terminal under control of the level signal of the second node.

For example, in the shift register unit provided by at least one embodiment of the present disclosure, the output terminal comprises a shift output terminal and at least one scan signal output terminal.

For example, in the shift register unit provided by at least one embodiment of the present disclosure, the at least one scan signal output terminal comprises one scan signal output terminal, the output circuit comprises a second transistor, a third transistor, and a second capacitor. A gate electrode of the second transistor is connected to the first node, a first electrode of the second transistor is connected to a clock signal terminal to receive a clock signal, a second electrode of the second transistor is connected to the shift output terminal; a gate electrode of the third transistor is connected to the first node, a first electrode of the third transistor is connected to the clock signal terminal to receive the clock signal, and a second electrode of the third transistor is connected to the scan signal output terminal; a first electrode of the second capacitor is connected to the first node, and a second electrode of the second capacitor is connected to the scan signal output terminal or the shift output terminal; and the clock signal is transmitted to the output terminal and serves as the output signal.

For example, the shift register unit provided by at least one embodiment of the present disclosure further comprises: a first node reset circuit, a total reset circuit, a second node control circuit, a first node noise reduction circuit, and an output noise reduction circuit. The first node reset circuit is connected to the first node and is configured to reset the first node in response to a reset signal; the total reset circuit is connected to the first node and is configured to reset the first node in response to a total reset signal; the second node control circuit is respectively connected to the first node, a second node, and a third node, and is configured to control a level of the second node and a level of the third node under control of the level signal of the first node; the first node noise reduction circuit is connected to the first node and the second node, and is configured to perform noise reduction on the first node under control of a level signal of the second node; the output noise reduction circuit is connected to the second node and the output terminal, and is configured to perform noise reduction on the output terminal under control of the level signal of the second node; the first node control circuit comprises a first capacitor, a first electrode of the first capacitor is connected to the first node, and a second electrode of the first capacitor is connected to the precharge control terminal to receive the precharge control signal; the output control circuit comprises a first transistor, a gate electrode of the first transistor is connected to the precharge control terminal to receive the precharge control signal, a first electrode of the first transistor is connected to the output terminal, and a second electrode of the first transistor is connected to a first voltage terminal to receive a first voltage; in the case where the output terminal comprises one shift output terminal and a scan signal output terminal, the output circuit comprises a second transistor, a third transistor, and a second capacitor, a gate electrode of the second transistor is connected to the first node, a first electrode of the second transistor is connected to a clock signal terminal to receive a clock signal, a second electrode of the second transistor is connected to the shift output terminal; a gate electrode of the third transistor is connected to the first node, a first electrode of the third transistor is connected to the clock signal terminal to receive the clock signal, and a second electrode of the third transistor is connected to the scan signal output terminal; a first electrode of the second capacitor is connected to the first node, and a second electrode of the second capacitor is connected to the scan signal output terminal or the shift output terminal; the clock signal is transmitted to the output terminal and serves as the output signal, the input circuit comprises a fourth transistor, a gate electrode and a first electrode of the fourth transistor are electrically connected to each other, and are configured to be both connected to an input terminal to receive the input signal, and a second electrode of the fourth transistor is configured to be connected to the first node; the first node reset circuit comprises a fifth transistor, a gate electrode of the fifth transistor is configured to be connected to a reset terminal to receive the reset signal, a first electrode of the fifth transistor is connected to the first node, and a second electrode of the fifth transistor is connected to a second voltage terminal to receive a second voltage; the total reset circuit comprises a sixth transistor, a gate electrode of the sixth transistor is connected to a total reset terminal to receive the total reset signal, a first electrode of the sixth transistor is connected to the first node, and a second electrode of the sixth transistor is connected to the second voltage terminal to receive the second voltage; the second node control circuit comprises a seventh transistor, an eighth transistor, a ninth transistor, a tenth transistor, a twenty-seventh transistor, a twenty-eighth transistor, a twenty-ninth transistor, and a twentieth transistor, a gate electrode of the seventh transistor is connected to a first control node, a first electrode of the seventh transistor is connected to a third voltage terminal to receive a third voltage, and a second electrode of the seventh transistor is connected to the second node; a gate electrode of the eighth transistor is connected to the first node, a first electrode of the eighth transistor is connected to the second node, and a second electrode of the eighth transistor is connected to the second voltage terminal to receive the second voltage; a gate electrode of the ninth transistor and a first electrode of the ninth transistor are electrically connected to each other, and are configured to be both connected to the third voltage terminal to receive the third voltage, and a second electrode of the ninth transistor is connected to the first control node; a gate electrode of the tenth transistor is connected to the first node, a first electrode of the tenth transistor is connected to the first control node, and a second electrode of the tenth transistor is connected to the second voltage terminal to receive the second voltage; a gate electrode of the twenty-seventh transistor is connected to a second control node, a first electrode of the twenty-seventh transistor is connected to a fourth voltage terminal to receive a fourth voltage, and a second electrode of the twenty-seventh transistor is connected to the third node; a gate electrode of the twenty-eighth transistor is connected to the first node, a first electrode of the twenty-eighth transistor is connected to the third node, and a second electrode of the twenty-eighth transistor is connected to the second voltage terminal to receive the second voltage; a gate electrode of the twenty-ninth transistor and a first electrode of the twenty-ninth transistor are electrically connected to each other, and are configured to be both connected to the fourth voltage terminal to receive the fourth voltage, and a second electrode of the twenty-ninth transistor is connected to the second control node; a gate electrode of the twentieth transistor is connected to the first node, a first electrode of the twentieth transistor is connected to the second control node, and a second electrode of the twentieth transistor is connected to the second voltage terminal to receive the second voltage; the first node noise reduction circuit comprises an eleventh transistor and a twenty-first transistor, a gate electrode of the eleventh transistor is connected to the second node, a first electrode of the eleventh transistor is connected to the first node, and a second electrode of the eleventh transistor is connected to the second voltage terminal to receive the second voltage; a gate electrode of the twenty-first transistor is connected to the third node, a first electrode of the twenty-first transistor is connected to the first node, and a second electrode of the twenty-first transistor is connected to the second voltage terminal to receive the second voltage; the output noise reduction circuit may be implemented as a twelfth transistor, a twenty-second transistor, a thirteenth transistor, and a twenty-third transistor, a gate electrode of the twelfth transistor is connected to the second node, a first electrode of the twelfth transistor is connected to the shift output terminal, and a second electrode of the twelfth transistor is connected to the second voltage terminal to receive the second voltage; a gate electrode of the twenty-second transistor is connected to the third node, a first electrode of the twenty-second transistor is connected to the shift output terminal, and a second electrode of the twenty-second transistor is connected to the second voltage terminal to receive the second voltage; a gate electrode of the thirteenth transistor is connected to the second node, a first electrode of the thirteenth transistor is connected to the scan signal output terminal, and a second electrode of the thirteenth transistor is connected to the first voltage terminal to receive the first voltage; and a gate electrode of the twenty-third transistor is connected to the third node, a first electrode of the twenty-third transistor is connected to the scan signal output terminal, and a second electrode of the twenty-third transistor is connected to the first voltage terminal to receive the first voltage.

At least one embodiment of the present disclosure also provides a gate driving circuit including a plurality of cascaded shift register units provided by any one of the embodiments of the present disclosure.

For example, in the gate driving circuit provided by at least one embodiment of the present disclosure, except for first to m-th stages of shift register units, a precharge control terminal of a remaining stage of shift register unit is connected to an output terminal of an upper stage of shift register unit that is separated by at least m stages from the remaining stage of shift register; except for the first to m-th stages of shift register units, an input terminal of the remaining stage of shift register unit is connected to an output terminal of an upper stage of shift register unit that is separated by (m−1) stages from the remaining stage of shift register; and except for last m-stage of shift register units, a reset terminal of the remaining stage of shift register unit is connected to an output terminal of a lower stage of shift register unit that is separated by (m−1) stages from the remaining stage of shift register; m is an integer greater than two.

At least one embodiment of the present disclosure also provides a display device including a gate driving circuit provided by any one of the embodiments of the present disclosure.

At least one embodiment of the present disclosure also provides a driving method of the shift register unit, and the driving method comprises: in a first phase, by the first node control circuit, charging the first node in response to the precharge control signal; in a second phase, by the input circuit, charging the first node in response to an input signal; and in a third phase, by the output circuit, outputting the output signal at the output terminal under control of the level signal of the first node.

For example, in the driving method provided by at least one embodiment of the present disclosure, the shift register unit further comprises an output control circuit, the first phase of the driving method further comprises: by the output control circuit, controlling the output terminal to be at an invalid output level in response to the precharge control signal.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
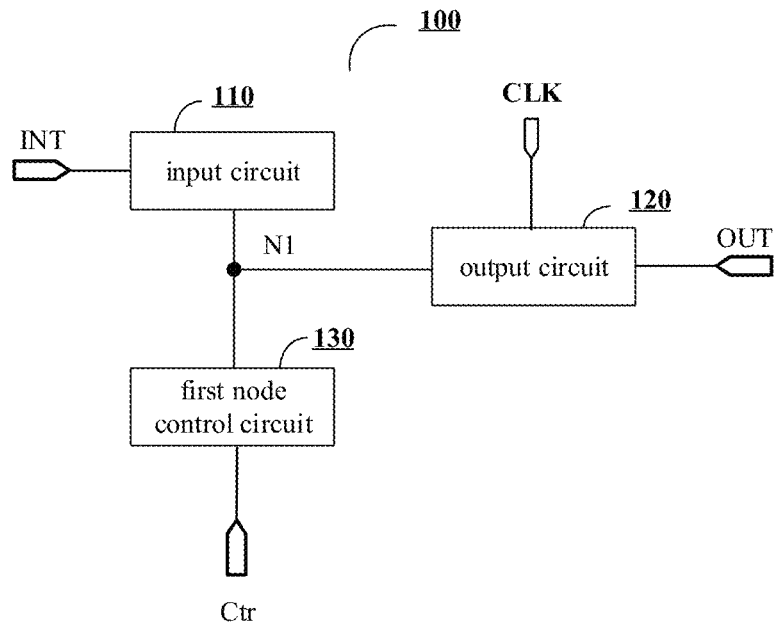
FIG. 1 is a schematic diagram of a shift register unit provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," "the," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below through several specific embodiments. In order to keep the following description of the embodiments of the present disclosure clear and concise, detailed descriptions of known functions and known components may be omitted. In the case where any component of an embodiment of the present disclosure appears in more than one drawing, the component is represented by the same or similar reference numeral in each drawing.

In a current display technology, such as a 3D display technology, in order to meet the needs of 3D games, a refresh frequency of a display screen is continuously increased, and for example, is increased to 144 Hz. Compared with a display screen with a refresh frequency of 60 Hz, a display screen with a refresh frequency of 144 Hz can display a smoother game scene, especially to eliminate the smear phenomenon of the display panel in 3D mode due to the refresh frequency of the display panel being too low. The high refresh frequency of the display screen means that the charging time of the GOA is shortened during the display of each frame of image. Therefore, in order to meet the charging rate, a high power voltage is usually used to charge the GOA. However, the high power voltage will accelerate the drift of the characteristics (for example, threshold voltage) of the transistor, so that a high level written to a pull-up node through the input circuit is lower than a predetermined value, therefore, it is difficult to control a level of a pull-down node through the pull-up node, furthermore affecting the output signal of the output terminal, also accelerating the aging of the display device at the same time, and affecting the life of the display device. In order to solve the above problems, it is necessary to improve the charging capability of the pull-up node in the GOA.

At least one embodiment of the present disclosure provides a shift register unit, and the shift register unit comprises an input circuit, an output circuit, and a first node control circuit. The input circuit is connected to a first node and is configured to charge the first node in response to an input signal; the output circuit is connected to the first node and is configured to output an output signal at an output terminal under control of a level signal of the first node; and the first node control circuit is connected to the first node and a precharge control terminal, respectively, and is configured to receive a precharge control signal from the precharge control terminal and charge the first node in response to the precharge control signal before the output terminal outputs the output signal. Embodiments of the present disclosure also provide a gate driving circuit, a display device, and a driving method corresponding to the above-mentioned shift register unit.

The shift register unit provided by the above embodiments of the present disclosure adopts a design of double bootstrap capacitors, thereby improving the charging capability of the first node (for example, a pull-up node) to solve the problem of insufficient charging of the first node (for example, the pull-up node) due to the characteristic drift of the transistor at a high refresh frequency, so that the stability of the circuit structure of the shift register unit is improved, and the service life of the display panel is extended.

The embodiments of the present disclosure and examples thereof will be described in detail below with reference to the drawings.

FIG. 1 is a schematic diagram of a shift register unit provided by at least one embodiment of the present disclosure. As shown in FIG. 1, the shift register unit 100 includes an input circuit 110, an output circuit 120, a first node N1, and a first node control circuit 130. A gate driving circuit can be obtained by cascading a plurality of shift register units 100. The gate driving circuit is used to drive a display panel, and sequentially provides scan signals for a plurality of gate lines of the display panel, thereby performing progressive scanning or interlaced scanning and the like while the display panel displays a frame of a picture.

As shown in FIG. 1, the input circuit 110 is configured to charge the first node N1 in response to an input signal. For example, in some examples, the input circuit 110 is connected to an input signal terminal INT and the first node N1 (for example, a pull-up node here), and is configured to be turned on under control of the input signal provided by the input signal terminal INT, so that the input signal terminal INT is connected to the first node N1, and thus, the input signal provided by the input signal terminal INT is input to the first node N1, and a potential of the first node N1 is charged (for example, pulled up) to a working potential.

The output circuit 120 includes an output terminal OUT, and is configured to output an output signal at the output terminal OUT under control of a level signal of the first node N1. For example, in some examples, the output circuit 120 is connected to a clock signal terminal CLK, the first node N1, and the output terminal OUT, and is configured to be turned on under control of the level signal of the first node N1, so as to transmit a clock signal provided by the clock signal terminal CLK to the output terminal OUT and to output the clock signal as the output signal at the output terminal OUT. Or, in other examples, the output circuit 120 is also connected to a voltage terminal (for example, a high voltage terminal), and uses a clock signal provided by the clock signal terminal CLK as a control signal to control whether the voltage terminal is connected to the output terminal OUT or not, thereby controlling whether a voltage signal of the voltage terminal is transmitted to the output terminal OUT and outputs as the output signal at the output terminal OUT.

For example, the output terminal OUT may include a plurality of output terminals, such as a shift output terminal and at least one scan signal output terminal, thereby outputting the output signal, such as the clock signal provided by the clock signal terminal CLK, to the shift output terminal and the scan signal output terminal, so as to improve the driving capability of the shift register unit 100. For example, in the shift register unit provided by at least one embodiment of the present disclosure, at least one scan signal output terminal includes one scan signal output terminal. For example, the shift output terminal of a current stage of shift register unit 100 is connected to a previous stage of shift register unit 100 and a next stage of shift register unit 100, which are adjacent to the current stage of shift register unit 100, to provide a precharge control signal, the input signal, or a reset signal to the previous stage of shift register unit 100 and the next stage of shift register unit 100, which are connected to the current stage of shift register unit 100, and the scan signal output terminal of the current stage of shift register unit 100 is connected to a pixel circuit of a pixel unit in the display panel to provide driving signals to the pixel circuit. Providing the shift output terminal and the scan signal output terminal separately can reduce the influence of the load and signal in the pixel area on the cascaded shift register units. For example, the shift output terminal and the scan signal output terminal output the same output signal. It should be noted that, in other examples, in the case where a plurality of scan signal output terminals are included, the respective scan signal output terminals may also output different output signals. The specific setting of the scan signal output terminals is determined according to the actual situation, which is not limited in the embodiments of the present disclosure.

The first node control circuit 130 is respectively connected to the first node N1 and a precharge control terminal Ctr, and is configured to receive a precharge control signal from the precharge control terminal Ctr, and charge the first node N1 in response to the precharge control signal before the output terminal OUT outputs the clock signal. For example, the timing of the precharge control signal provided by the precharge control terminal Ctr is earlier than the timing of the input signal. Before the input signal charges the first node N1, the first node control circuit 130 can charge the first node N1 in advance, and at the same time, under the control of the level signal of the first node N1, the first node control circuit 130 can perform a control operation (for example, a pull-down discharge) on the second node (for example, a pull-down node here) to prevent the level of the first node N1 from being discharged through the transistor (for example, the eleventh transistor T11) controlled by the second node N2, and therefore, the charging capability of the first node N1 in the circuit can be improved.

The shift register unit provided by the above embodiments of the present disclosure can improve the charging capability of the pull-up node (that is, the first node) to solve the problem of insufficient charging of the pull-up node due to the characteristic drift of the transistor at a high refresh frequency, so that the stability of the circuit structure of the shift register unit is improved, and the service life of the display panel is extended.

Figure 2:
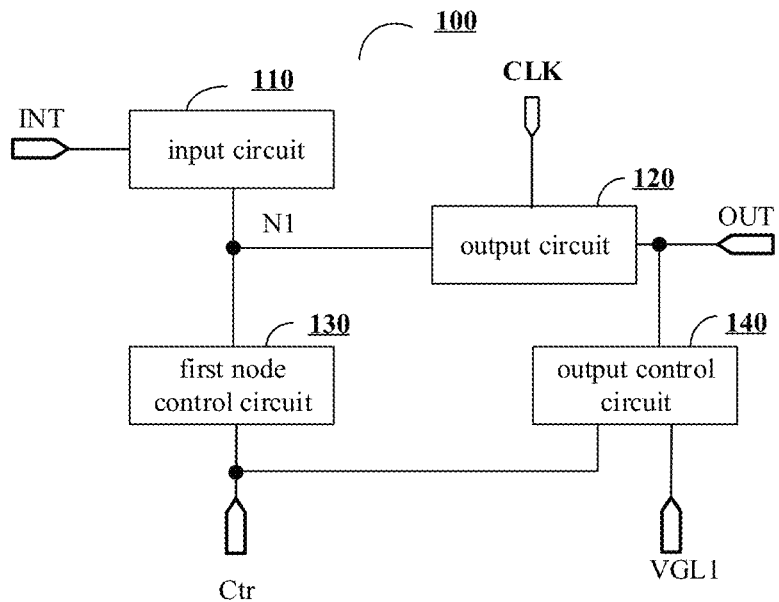
FIG. 2 is a schematic diagram of another shift register unit provided by at least one embodiment of the present disclosure.

FIG. 2 is a schematic diagram of another shift register unit provided by at least one embodiment of the present disclosure. As shown in FIG. 2, the shift register unit 100 further includes an output control circuit 140. It should be noted that other circuit structures of the shift register unit 100 as shown in FIG. 2 are basically the same as those of the shift register unit 100 as shown in FIG. 1, and details are not repeated here.

The output control circuit 140 is respectively connected to the output terminal OUT and the precharge control terminal Ctr, and is configured to receive the precharge control signal from the precharge control terminal Ctr and to control the output terminal OUT to be at an invalid output level during a non-output phase in response to the precharge control signal. For example, the output control circuit 140 is connected to the precharge control terminal Ctr, the output terminal OUT, and a first voltage terminal VGL1 (for example, providing a low level) or a separately provided voltage terminal (for example, a low voltage terminal), and is configured to connect the output terminal OUT to the first voltage terminal VGL1 in response to the precharge control signal received by the precharge control terminal Ctr, so as to achieve to perform noise reduction on the output terminal OUT, thereby avoiding to cause an erroneous output of the output terminal OUT during a phase when the first node control circuit 130 precharges the first node N1.

Please note that the "valid output level" in the shift register unit provided by the embodiment of the present disclosure refers to a level that enables a switching transistor in a pixel circuit of a display panel connected to the level to be turned on so that a data signal can be written into the pixel circuit, and accordingly, "invalid output level" refers to a level that cannot enable a switching transistor in a pixel circuit connected to the level to be turned on (i.e., the switching transistor is turned off). According to factors, such as a type of the switching transistor (N-type or P-type) in the pixel circuit, the valid output level may be higher or lower than the invalid output level. In general, the shift register unit outputs a square wave pulse signal at the output terminal when the shift register unit operates, the valid output level corresponds to a level of a square wave pulse portion of the square wave pulse signal, and the invalid output level corresponds to a level of a non-square wave pulse portion of the square wave pulse signal.

The input circuit and output circuit (and the first node N1) included in the shift register unit as shown in FIGS. 1 and 2 can be implemented in various forms, such as the basic structure of 4T1C, and in different implementations, these shift register units may further include other functional modules, for example, see the following description, however, the embodiments of the present disclosure are not limited to these specific forms.

Figure 3:
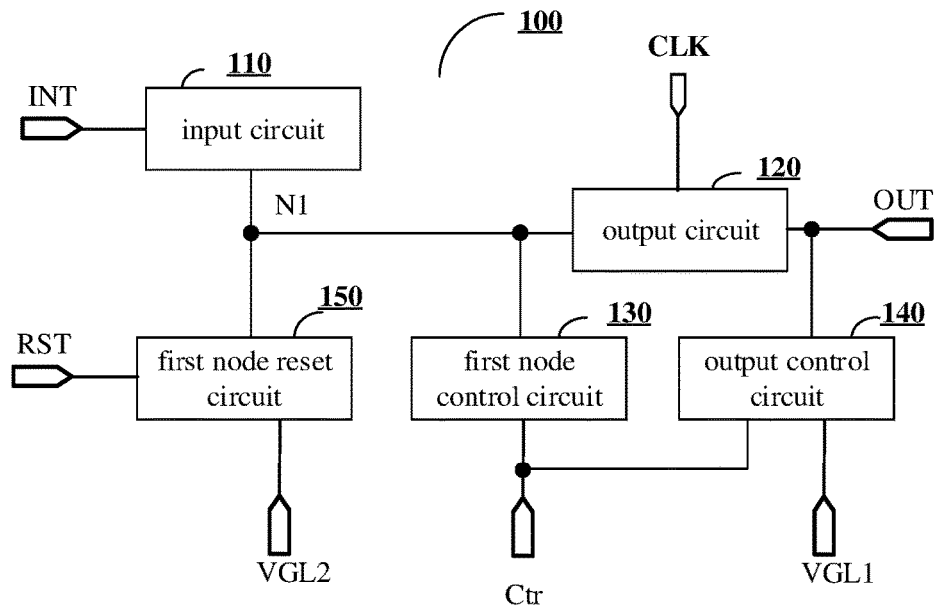
FIG. 3 is a schematic diagram of still another shift register unit provided by at least one embodiment of the present disclosure.

FIG. 3 is a schematic diagram of still another shift register unit provided by at least one embodiment of the present disclosure. As shown in FIG. 3, the shift register unit 100 further includes a first node reset circuit 150. It should be noted that other circuit structures of the shift register unit 100 as shown in FIG. 3 are basically the same as those of the shift register unit 100 as shown in FIG. 2, and details are not repeated herein again.

For example, the first node reset circuit 150 is connected to the first node N1 and is configured to reset the first node N1 in response to a reset signal. For example, the first node reset circuit 150 may be configured to be connected to the first node N1, a second voltage terminal VGL2 (for example, providing a low level) or a separately provided voltage terminal (for example, a low voltage terminal), and the reset terminal RST, so that under the control of the reset signal input from the reset terminal RST, the first node reset circuit 150 can electrically connect the first node N1 to the second voltage terminal VGL2 or the low voltage terminal to reset the first node N1.

Figure 4:
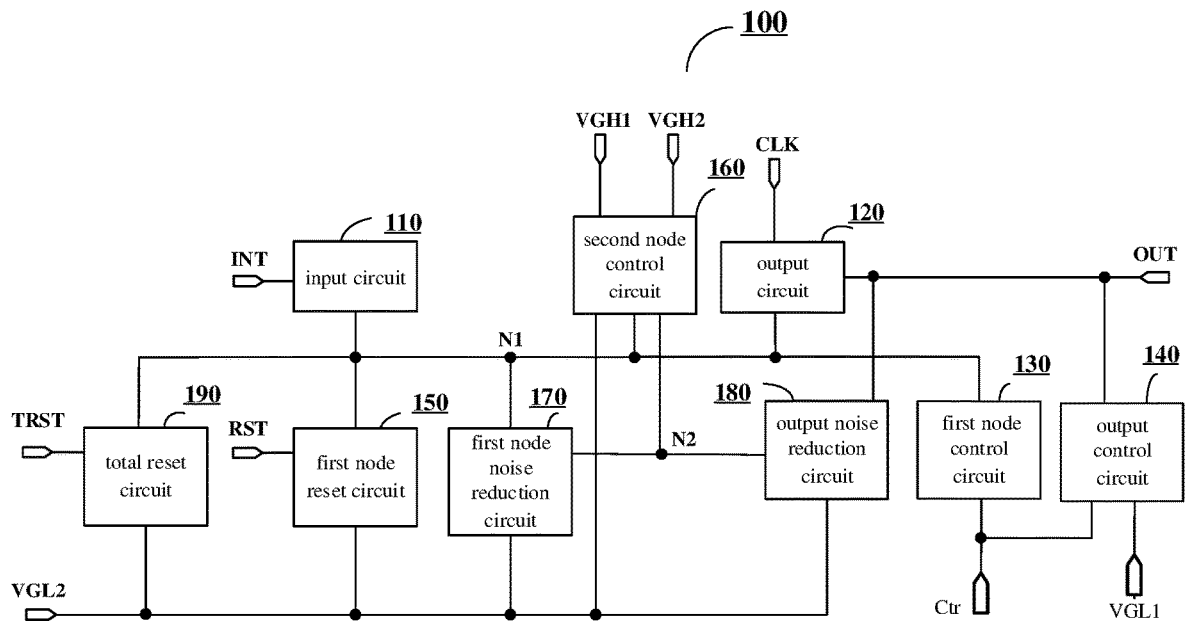
FIG. 4 is a schematic diagram of still yet another shift register unit provided by at least one embodiment of the present disclosure.

FIG. 4 is a schematic diagram of still yet another shift register unit provided by at least one embodiment of the present disclosure. As shown in FIG. 4, in some examples, the shift register unit 100 further includes a second node control circuit 160, a first node noise reduction circuit 170, and an output noise reduction circuit 180. It should be noted that other circuit structures of the shift register unit 100 as shown in FIG. 4 are basically the same as those of the shift register unit 100 shown in FIG. 3, and details are not repeated here again.

The second node control circuit 160 is connected to the first node N1 and the second node N2, and is configured to control a level of the second node N2 under the control of the level signal of the first node N1. For example, in some examples, the second node control circuit 160 is connected to the first node N1, the second node N2, the second voltage terminal VGL2, a third voltage terminal VGH1, and a fourth voltage terminal VGH2 or a separately provided voltage terminal (for example, a high voltage terminal), thereby controlling the level of the second node N2. For example, in the case where the first node N1 is at a low level, the second node control circuit 160 causes the second node N2 to be connected to the third voltage terminal VGH1 or the fourth voltage terminal VGH2, thereby pulling up the second node N2 to a high level; for example, in the case where the first node N1 is at a high level, the second node control circuit 160 causes the second node N2 to be connected to the second voltage terminal VGL2 or the separately provided voltage terminal (for example, a low voltage terminal), thereby pulling down the second node N2 to a low level. For example, the second node control circuit 160 may be implemented as an inverter, and the embodiments of the present disclosure are not limited in this aspect.

For example, in other examples, the second node control circuit 160 may further include a third node (not shown in the figure). For example, in this example, the level of the second node N2 is controlled by the level of the first node N1 and the third voltage provided by the third voltage terminal VGH1, a level of the third node N3 is controlled by the level of the first node N1 and the fourth voltage provided by the fourth voltage terminal VGH2, and the specific connection manner will be described in detail below.

For example, in some examples, the third voltage terminal VGH1 and the fourth voltage terminal VGH2 may be set to alternately input a high level, that is, in the case where the third voltage terminal VGH1 inputs a high level, the fourth voltage terminal VGH1 inputs a low level; in the case where the third voltage terminal VGH1 inputs a low level, the fourth voltage terminal VGH2 is input a high level, so that the second node N2 and the third node N3 work alternately, so that the transistors connected to the second node N2 and the third node N3 can work alternately, thereby extending the service life of these transistors. For example, in other examples, the third voltage terminal VGH1 and the fourth voltage terminal VGH2 may also be replaced by clock signal terminals that alternately provide a high level (or a DC low level when the implemented transistor is a P type transistor), and the embodiments of the present disclosure are not limited thereto.

The first node noise reduction circuit 170 is connected to the first node N1 and the second node N2, and is configured to perform noise reduction on the first node N1 under the control of the level of the second node N2. For example, the first node noise reduction circuit 170 is connected to the first node N1, the second node N2, and the second voltage terminal VGL2, and is configured to be turned on in the case where the second node N2 is, for example, at a high level, so that the first node N1 is connected to the second voltage terminal VGL2 or the separately provided voltage terminal (for example, a low voltage terminal), thereby pulling down the potential of the first node N1 to a non-working potential to achieve to perform noise reduction on the first node N1.

The output noise reduction circuit 180 is connected to the second node N2 and the output terminal OUT, and is configured to perform noise reduction on the output terminal OUT under the control of the level of the second node N2. For example, the output noise reduction circuit 180 is connected to the second node N2, the second voltage terminal VGL2, and the output terminal OUT, and is configured to be turned on in the case where the second node N2 is at a high level, for example, so that the output terminal OUT is connected to the second voltage terminal VGL2 or the separately provided voltage terminal (for example, a low voltage terminal) to achieve to perform noise reduction on the output terminal OUT.

As shown in FIG. 4, in other examples, the shift register unit 100 further includes a total reset circuit 190.

For example, the total reset circuit 190 is connected to the first node N1 and is configured to reset the first node N1 in response to a total reset signal. For example, the total reset circuit 190 may be configured to be connected to the first node N1, the second voltage terminal VGL2 (for example, providing a low level) or a separately provided voltage terminal (for example, a low voltage terminal), and a total reset terminal TRST, so that under the control of the total reset signal input from the total reset terminal TRST, the first node N1 is electrically connected to the second voltage terminal VGL2 or the low voltage terminal, so as to reset the first node N1.

For example, the first voltage terminal VGL1 is configured to provide a DC low level signal (for example, the DC low level signal is lower than or equal to a low level portion of the clock signal), for example, the first voltage terminal VGL1 is ground. Here, the DC low level signal is referred to as a first voltage, for example, this case can apply to the following embodiments, and similar portions will not be described again again.

For example, the second voltage terminal VGL2 is configured to provide a DC low level signal (for example, the DC low level signal is lower than or equal to a low level portion of the clock signal), for example, the second voltage terminal VGL2 is ground. Here, the DC low level signal is referred to as a second voltage, and the second voltage may be less than or equal to the first voltage, this case can apply to the following embodiments, and similar portions will not be described again.

For example, the third voltage terminal VGH1 is configured to provide a DC high level signal, and the DC high level signal provided by the third voltage terminal VGH1 is referred to as a third voltage. The fourth voltage terminal VGH2 is also configured to provide a DC high level signal, and the DC high level signal provided by the fourth voltage terminal VGH2 is referred to as a fourth voltage. For example, the third voltage and the fourth voltage may be the same voltage, and both are greater than the first voltage and the second voltage. This case can apply to the following embodiments, and similar portions will not be described again.

Figure 5:
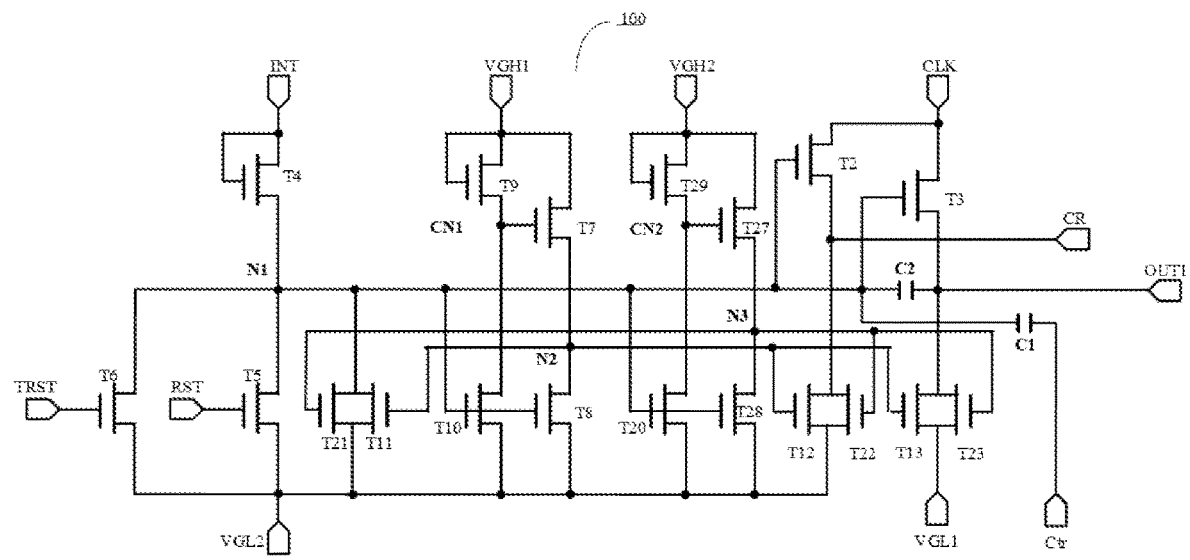
FIG. 5 is a circuit schematic diagram of a specific implementation example of the shift register unit as shown in FIG. 4.
Figure 6:
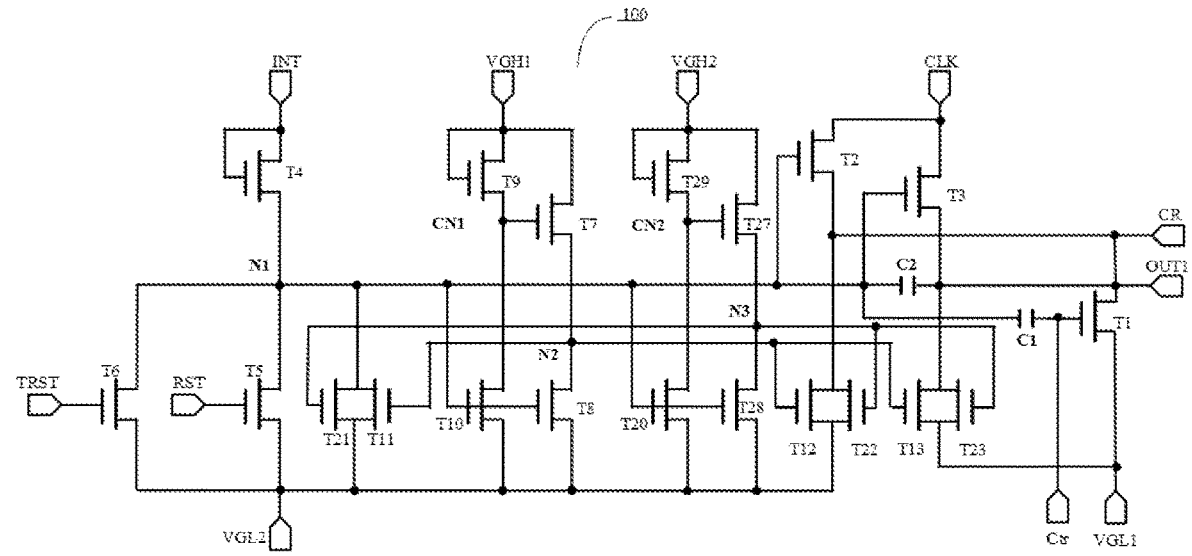
FIG. 6 is a circuit schematic diagram of another specific implementation example of the shift register unit as shown in FIG. 4.

FIG. 5 is a circuit schematic diagram of a specific implementation example of the shift register unit as shown in FIG. 4. As shown in FIG. 5, the shift register unit 100 includes second to twenty-ninth transistors T2 to T29, and further includes a first capacitor C1 to a second capacitor to C2. FIG. 6 is a circuit schematic diagram of another specific implementation example of the shift register unit as shown in FIG. 4. It should be noted that, the following embodiments are described by taking a case that each transistor is an N-type transistor as an example, but this does not constitute a limitation on the embodiments of the present disclosure.

The input circuit 110 includes a fourth transistor T4. A gate electrode and a first electrode of the fourth transistor T4 are electrically connected to each other, and are configured to be both connected to the input terminal INT to receive the input signal, and a second electrode of the fourth transistor T4 is configured to be connected to the first node N1, so that in the case where the fourth transistor T4 is turned on due to a turn-on signal (e.g., a high level signal) received by the input terminal INT, the turn-on signal is used to charge the first node N1 to a high level. For example, the gate electrode and the first electrode of the fourth transistor T4 may also be connected to the input terminal INT or other high voltage terminal (such as the third voltage terminal VGH1 or the fourth voltage terminal VGH2), and the embodiments of the present disclosure are not limited thereto.

The output circuit 120 includes a second transistor T2, a third transistor T3, and a second capacitor C2. A gate electrode of the second transistor T2 is connected to the first node N1, a first electrode of the second transistor T2 is connected to the clock signal terminal CLK to receive a clock signal, and a second electrode of the second transistor T2 is connected to the shift output terminal CR. A gate electrode of the third transistor T3 is connected to the first node N1, a first electrode of the third transistor T3 is connected to the clock signal terminal CLK to receive the clock signal, and a second electrode of the third transistor T3 is connected to the scan signal output terminal OUT1. A first electrode of the second capacitor C2 is connected to the first node N1, and a second electrode of the second capacitor C2 is connected to the scan signal output terminal OUT1. For example, in other examples, the second electrode of the second capacitor C2 may also be connected to the shift output terminal CR, which is not limited in the embodiments of the present disclosure. It should be noted that, the present disclosure is not limited to this case, the shift register unit may further include more output signals and scan signal output terminals corresponding to the output signals.

The first node control circuit 130 includes a first capacitor C1. A first electrode of the first capacitor C1 is connected to the first node N1, and a second electrode of the first capacitor C1 is connected to the precharge control terminal Ctr to receive the precharge control signal. According to the characteristic that the voltage across two terminals of the capacitor cannot be abruptly changed, so that the voltage of the first electrode (that is, the first node N1) of the first capacitor C1 bootstraps according to the voltage of the precharge control signal received by the second electrode of the first capacitor C1, so as to achieve to precharge the first node N1 and solve the problem of insufficient charging of the first node (for example, the pull-up node) due to the characteristic drift of the transistor at a high refresh frequency, so that the stability of the circuit structure of the shift register unit is improved, and the service life of the display panel is extended.

The first node reset circuit 150 includes a fifth transistor T5. A gate electrode of the fifth transistor T5 is configured to be connected to a reset terminal RST to receive the reset signal, a first electrode of the fifth transistor T5 is connected to the first node N1, and a second electrode of the fifth transistor T5 is connected to the second voltage terminal VGL2 to receive the second voltage. In the case where the fifth transistor T5 is turned on in response to the reset signal, the first node N1 is electrically connected to the second voltage terminal VGL2, so that the first node N1 can be reset. For example, the reset terminal RST is connected to the output terminal of the shift register unit, that is cascaded to the reset terminal RST, to achieve to perform real-time reset on the first node N1 of the current stage of shift register unit during the shift output of the gate scan signals, thereby avoiding erroneous output at the output terminal.

The total reset circuit 190 includes a sixth transistor T6. A gate electrode of the sixth transistor T6 is connected to the total reset terminal TRST to receive the total reset signal, a first electrode of the sixth transistor T6 is connected to the first node N1, and a second electrode of the sixth transistor T6 is connected to the second voltage terminal VGL2 to receive the second voltage. In the case where the sixth transistor T6 is turned on in response to the total reset signal, the first node N1 is electrically connected to the second voltage terminal VGL2, so that the first node N1 can be reset. For example, the total reset circuit 190 is configured to perform a global reset on all cascaded shift register units at a beginning phase of the display phase of one frame of image or an end phase of the display phase of one frame of image. For example, the timing of the total reset signal is earlier than the timing of a trigger signal (the trigger signal will be described in detail later) that controls the beginning of the display phase of a frame of image, so that the first nodes N1 of all shift register unit can be reset in the beginning phase of the display phase of the frame of image, so as to avoid the display screen from being abnormal.

For example, in some examples, the second node control circuit 160 includes a seventh transistor T7, an eighth transistor T8, a ninth transistor T9, and a tenth transistor T10. A gate electrode of the seventh transistor T7 is connected to a first control node CN1, a first electrode of the seventh transistor T7 is connected to the third voltage terminal VGH1 to receive the third voltage, and a second electrode of the seventh transistor T7 is connected to the second node N2; a gate electrode of the eighth transistor T8 is connected to the first node N1, a first electrode of the eighth transistor T8 is connected to the second node N2, and a second electrode of the eighth transistor T8 is connected to the second voltage terminal VGL2 to receive the second voltage. A gate electrode of the ninth transistor T9 and a first electrode of the ninth transistor T9 are electrically connected to each other, and both are configured to be connected to the third voltage terminal VGH1 to receive the third voltage, and a second electrode of the ninth transistor T9 is connected to the first control node CN1; a gate electrode of the tenth transistor T10 is connected to the first node N1, a first electrode of the tenth transistor T10 is connected to the first control node CN1, and a second electrode of the tenth transistor T10 is connected to the second voltage terminal VGL2 to receive the second voltage.

For example, in other examples, the second node control circuit 160 further includes a twenty-seventh transistor T27, a twenty-eighth transistor T28, a twenty-ninth transistor T29, and a twentieth transistor T20. A gate electrode of the twenty-seventh transistor T27 is connected to a second control node CN2, a first electrode of the twenty-seventh transistor T27 is connected to the fourth voltage terminal VGH2 to receive the fourth voltage, and a second electrode of the twenty-seventh transistor T27 is connected to the third node N3; a gate electrode of the twenty-eighth transistor T28 is connected to first node N1, a first electrode of the twenty-eighth transistor T28 is connected to the third node N3, and a second electrode of the twenty-eighth transistor T28 is connected to the second voltage terminal VGL2 to receive the second voltage. A gate electrode of the twenty-ninth transistor T29 and a first electrode of the twenty-ninth transistor T29 are electrically connected to each other, and are configured to be connected to the fourth voltage terminal VGH2 to receive the fourth voltage, and a second electrode of the twenty-ninth transistor T29 is connected to the second control node CN2; and a gate electrode of the twentieth transistor T20 is connected to the first node N1, a first electrode of the twentieth transistor T20 is connected to the second control node CN2, and a second electrode of the twentieth transistor T20 is connected to the second voltage terminal VGL2 to receive the second voltage.

The first node noise reduction circuit 170 includes an eleventh transistor T11 and a twenty-first transistor T21. A gate electrode of the eleventh transistor T11 is connected to the second node N2, a first electrode of the eleventh transistor T11 is connected to the first node N1, and a second electrode of the eleventh transistor T11 is connected to the second voltage terminal VGL2 to receive the second voltage. The eleventh transistor T11 is turned on in the case where the second node N2 is at a high potential, and connects the first node N1 to the second voltage terminal VGL2, so that the first node N1 can be pulled down (for example, discharged) to achieve noise reduction. A gate electrode of the twenty-first transistor T21 is connected to the third node N3, a first electrode of the twenty-first transistor T21 is connected to the first node N1, and a second electrode of the twenty-first transistor T21 is connected to the second voltage terminal VGL2 to receive the second voltage. The twenty-first transistor T21 is turned on in the case where the third node N3 is at a high potential, and connects the first node N1 to the second voltage terminal VGL2, so that the first node N1 can be pulled down to achieve noise reduction. For example, the eleventh transistor T11 and the twenty-first transistor T21 work alternately under the control of the levels of the second node N2 and the third node N3, respectively, to extend the service life of these transistors.

For example, in some examples, the output terminal OUT includes a shift output terminal CR and one scan signal output terminal OUT1. The output noise reduction circuit

180 may be implemented as a twelfth transistor T12, a twenty-second transistor T22, a thirteenth transistor T13, and a twenty-third transistor T23. The twelfth transistor T12 and the twenty-second transistor T22 are used to perform noise reduction on the shift output terminal CR, and the thirteenth transistor T13 and the twenty-third transistor T23 are used to perform noise reduction on the scan signal output terminal OUT1. In the case where more scan signal output terminals are included, the output noise reduction circuit 180 may further include more transistors to perform noise reduction on the scan signal output terminals, respectively.

A gate electrode of the twelfth transistor T12 is connected to the second node N2, a first electrode of the twelfth transistor T12 is connected to the shift output terminal CR, and a second electrode of the twelfth transistor T12 is connected to the second voltage terminal VGL2 to receive the second voltage. The twelfth transistor T12 is turned on in the case where the second node N2 is at a high potential, and connects the shift output terminal CR to the second voltage terminal VGL2, so that noise reduction can be performed on the shift output terminal CR. A gate electrode of the twenty-second transistor T22 is connected to the third node N3, a first electrode of the twenty-second transistor T22 is connected to the shift output terminal CR, and a second electrode of the twenty-second transistor T22 is connected to the second voltage terminal VGL2 to receive the second voltage. The twenty-second transistor T22 is turned on in the case where the third node N3 is at a high potential, and connects the shift output terminal CR to the second voltage terminal VGL2, so that the noise reduction can be performed on the shift output terminal CR. For example, the twelfth transistor T12 and the twenty-second transistor T22 alternately work under the control of the levels of the second node N2 and the third node N3, respectively, to extend the service life of these transistors.

A gate electrode of the thirteenth transistor T13 is connected to the second node N2, a first electrode of the thirteenth transistor T13 is connected to the scan signal output terminal OUT1, and a second electrode of the thirteenth transistor T13 is connected to the first voltage terminal VGL1 to receive the first voltage. The thirteenth transistor T13 is turned on in the case where the second node N2 is at a high potential, and connects the scan signal output terminal OUT1 to the first voltage terminal VGL1, so that the noise reduction can be performed on the scan signal output terminal OUT1. A gate electrode of the twenty-third transistor T23 is connected to the third node N3, a first electrode of the twenty-third transistor T23 is connected to the scan signal output terminal OUT1, and a second electrode of the twenty-third transistor T23 is connected to the first voltage terminal VGL1 to receive the first voltage. The twenty-third transistor T23 is turned on in the case where the third node N3 is at a high potential, and connects the scan signal output terminal OUT1 to the first voltage terminal VGL1, so that the noise reduction can be performed on the scan signal output terminal OUT1. For example, the thirteenth transistor T13 and the twenty-third transistor T23 alternately work under the control of the levels of the second node N2 and the third node N3, respectively, to extend the service life of these transistors.

As shown in FIG. 6, the circuit structure of the shift register unit 100 is basically the same as the circuit structure as shown in FIG. 5, except that the shift register unit 100 further includes a first transistor T1, and similar portions are not repeated here again.

As shown in FIG. 6, the output control circuit 140 includes a first transistor T1. A gate electrode of the first transistor T1 is connected to the precharge control terminal Ctr to receive the precharge control signal, a first electrode of the first transistor T1 is connected to the output terminal OUT (e.g., the shift output terminal CR and/or the scan signal output terminal OUT1), and a second electrode of the first transistor T1 is connected to the first voltage terminal VGL1 to receive the first voltage. For example, the first transistor T1 is turned on in response to the precharge control signal received by the precharge control terminal Ctr, and connects the shift output terminal CR and/or the scan signal output terminal OUT1 to the first voltage terminal VGL1, respectively, so as to achieve to pull down the shift output terminal CR and the scan signal output terminal OUT1, thereby avoiding to cause the erroneous output of the shift output terminal CR and the erroneous output of the scan signal output terminal OUT1 during the phase of precharging the first node N1 through the first node control circuit 130.

In the embodiments of the present disclosure, for example, in the case where each circuit is implemented as N-type transistors, the term "pull up" means charging a node or an electrode of a transistor so as to increase an absolute value of a level of the node or the electrode, thereby implementing an operation (e.g., turn-on) of the corresponding transistor; the term "pull down" means discharging a node or an electrode of a transistor so as to decrease an absolute value of a level of the node or the electrode, thereby implementing an operation (e.g., turn-off) of the corresponding transistor.

For another example, in the case where each circuit is implemented as P-type transistors, the term "pull up" means discharging a node or an electrode of a transistor so as to decrease an absolute value of a level of the node or the electrode, thereby implementing the operation (e.g., turn-on) of the corresponding transistor; the term "pull down" means charging a node or an electrode of a transistor so as to increase an absolute value of a level of the node or the electrode, thereby implementing the operation (e.g., turn-off) of the corresponding transistor.

It should be noted that in the description of each embodiment of the present disclosure, the first node N1, the second node N2, the third node N3, the first control node CN1, and the second control node CN2 do not indicate actual existing components (physical structures or points), but rather indicate convergence points, that is, functional convergence points, of related electrical connections in a circuit diagram.

It should be noted that, transistors used in the embodiments of the present disclosure may be thin film transistors, field effect transistors, or other switching devices with the same characteristics, and the embodiments of the present disclosure are described by taking thin film transistors as an example. A source electrode and a drain electrode of the transistor used herein may be symmetrical in structure, so the source electrode and the drain electrode of the transistor may have no difference in structure. In the embodiments of the present disclosure, in order to distinguish two electrodes of the transistor apart from a gate electrode, one of the two electrodes is directly referred to as a first electrode, and the other of the two electrodes is referred to as a second electrode.

In addition, the transistors in the embodiments of the present disclosure are described by taking N-type transistors as an example, in this case, the first electrode of the transistor is a drain electrode and the second electrode is a source electrode. It should be noted that the present disclosure includes but is not limited thereto. For example, one or more transistors in the shift register unit 100 provided by the embodiment of the present disclosure may also be a P-type transistor, in this case, the first electrode of the transistor is a source electrode, and the second electrode is a drain electrode, so long as that various electrodes of the selected-type transistor are correspondingly connected with reference to the electrodes of the corresponding transistor in the embodiment of the present disclosure, and the corresponding voltage terminals provide the corresponding high voltages or low voltages. In the case where N-type transistors are adopted, Indium Gallium Zinc Oxide (IGZO) can be used as an active layer of the thin film transistor, compared with adopting Low Temperature Poly Silicon (LTPS) or amorphous silicon (such as hydrogenated amorphous silicon) as the active layer of the thin film transistor, a size of the transistor with Indium Gallium Zinc Oxide as the active layer can be effectively reduced and leakage current can be prevented.

Figure 7:
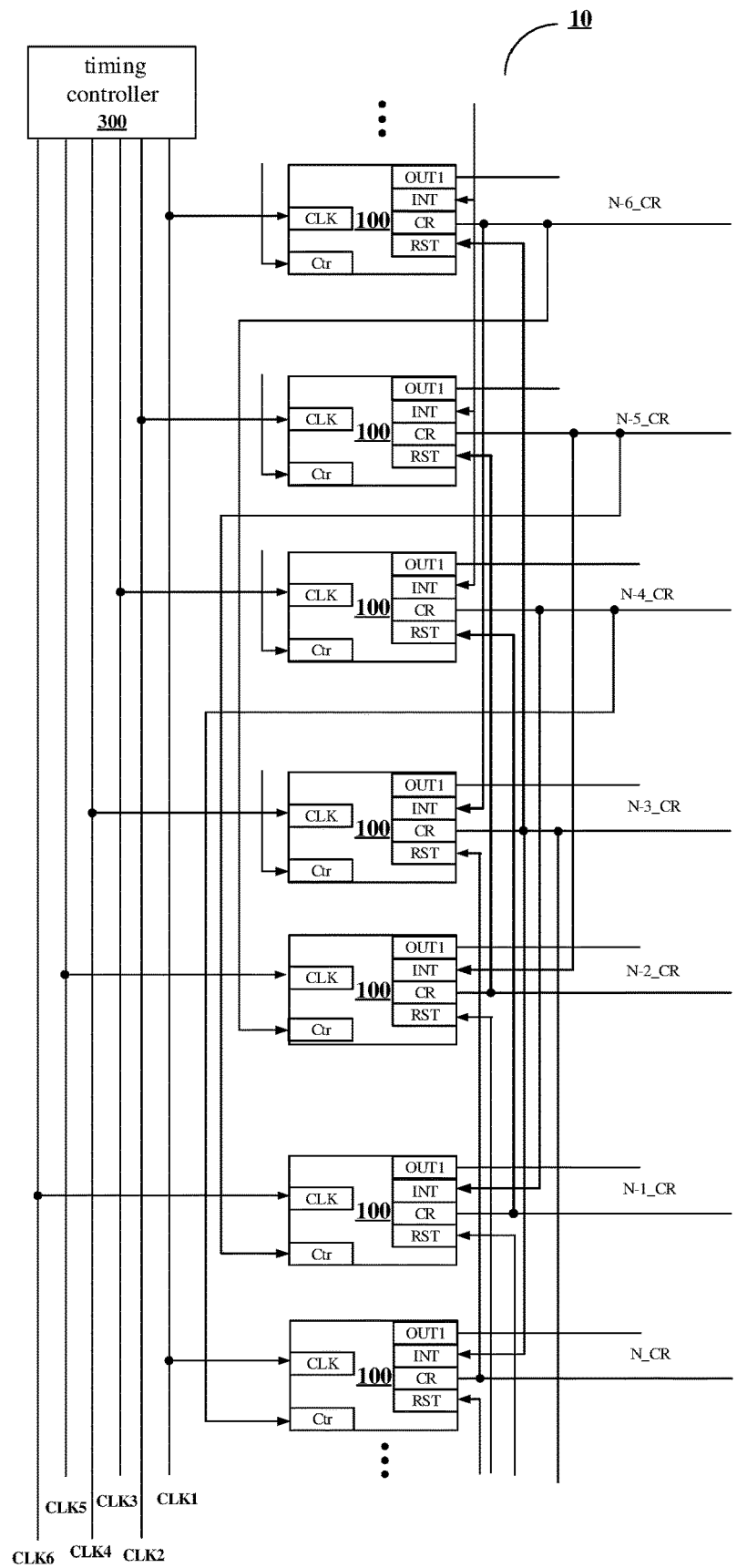
FIG. 7 is a schematic diagram of a gate driving circuit provided by at least one embodiment of the present disclosure.

At least one embodiment of the present disclosure also provides a gate driving circuit. FIG. 7 is a schematic diagram of a gate driving circuit provided by at least one embodiment of the present disclosure. As shown in FIG. 7, the gate driving circuit 10 includes a plurality of shift register units 100 that are cascaded. Any one or more of the shift register units 100 may adopt the structure or a modification of the shift register unit 100 provided by any one of embodiments of the present disclosure, for example, may adopt the shift register unit 100 as shown in FIG. 5 and may also adopt the shift register unit 100 as shown in FIG. 6. For example, the gate driving circuit 10 can be directly integrated on the array substrate of the display device by using the semiconductor manufacturing process that is the same as that of the thin film transistor, so as to achieve the progressive or interlaced scanning driving function.

For example, except for first to m-th (m is an integer greater than two) stages of shift register units, a precharge control terminal Ctr of a remaining stage of shift register unit is connected to an output terminal of a upper stage of shift register unit that is separated by at least m stages from the remaining stage of shift register; except for the first to m-th stages of shift register units, an input terminal INT of the remaining stage of shift register unit is connected to an output terminal OUT of an upper stage of shift register unit that is separated by (m−1) stages from the remaining stage of shift register; except for last m-stage of shift register units, a reset terminal RST of the remaining stage of shift register unit is connected to an output terminal OUT of a lower stage of shift register unit that is separated by (m−1) stages from the remaining stage of shift register.

As shown in FIG. 7, the gate driving circuit 10 further includes a first clock signal line CLK1, a second clock signal line CLK2, a third clock signal line CLK3, a fourth clock signal line CLK4, a fifth clock signal line CLK5, and a sixth clock signal line CLK6.

For example, as shown in FIG. 7, the first clock signal line CLK1 is connected to, for example, a clock signal terminal CLK of a (6n−5)-th (n is an integer greater than 0) stage of shift register unit; the second clock signal line CLK2 is connected to, for example, a clock signal terminal CLK of a (6n−4)-th stage of shift register unit; the third clock signal line CLK3 is connected to, for example, a clock signal terminal CLK of a (6n−3)-th stage of shift register unit; the fourth clock signal line CLK4 is connected to, for example, a clock signal terminal CLK of a (6n−2)-th stage of shift register unit; the fifth clock signal line CLK5 is connected to, for example, a clock signal terminal CLK of a (6n−1)-th stage of shift register unit; and the sixth clock signal line CLK6 is connected to, for example, a clock signal terminal CLK of a (6n)-th stage of shift register unit. It should be noted that the embodiments of the present disclosure may also include other connection modes, and the embodiments of the present disclosure do not limit the connection mode of the clock signal lines.

It should be noted that in FIG. 7, N−6_CR (N is an integer greater than 0) represents a shift output terminal of an (N−6)-th stage of shift register unit, N−5_CR represents a shift output terminal of an (N−5)-th stage of shift register unit, N−4_CR represents a shift output terminal of an (N−4)-th stage of shift register unit, N−3_CR represents a shift output terminal of an (N−3)-th stage of shift register unit, N−2_CR represents a shift output terminal of an (N−2)-th stage of shift register unit, N−1_CR represents a shift output terminal of an (N−1)-th stage of shift register unit, N_CR represents a shift output terminal of an N-th stage of shift register unit, and son on. The reference numerals in the following embodiments are similar to those described herein, and similar portions will not be described again.

For example, as shown in FIG. 7, except for the last three stages of shift register units, a reset terminal RST of the remaining stage of shift register unit is connected to a shift output terminal CR of a lower stage of shift register unit that is separated by two stages from the remaining stage of shift register. Except for a first stage of shift register unit, a second stage of shift register unit, and a third stage of shift register unit, an input terminal INT of the remaining stage of shift register unit is connected to a shift output terminal CR of a upper stage of shift register unit that is separated by two stages from the remaining stage of shift register.

For example, the precharge control terminal Ctr (i.e., the second electrode of the first capacitor C1) of an N-th stage of shift register unit 100 of the gate driving circuit 10 is connected to the shift output terminal CR of an upper stage of shift register unit that is separated from the N-th stage of shift register unit 100 by three stages, that is, is connected to the shift output terminal CR of an (N−4)-th stage of shift register unit, the precharge control terminal Ctr of an (N−1)-th stage of shift register unit 100 of the gate driving circuit 10 is connected to the shift output terminal CR of an (N−5)-th stage of shift register unit, and the precharge control terminal Ctr of an (N−2)-th stage of shift register unit 100 of the gate driving circuit 10 is connected to the shift output terminal CR of an (N−6)-th stage of shift register unit. For example, the precharge control terminal Ctr of each stage of shift register unit 100 may also be connected to the shift output terminal CR of an upper stage of shift register unit that separated from each stage of shift register unit 100 by four, five, and more stages, which is not limited in the embodiments of the present disclosure. However, from the perspective of the storage capacity of the first capacitor, it is still better to choose a shift output terminal with fewer stages separated from the shift register unit, thereby avoiding the storage capacity of the capacitor from affecting charging the first node N1.

For example, an input terminal INT of the first stage of shift register unit, an input terminal INT of the second stage of shift register unit, and an input terminal INT of the third stage of shift register unit may be configured to receive a trigger signal STV, and reset terminals RST of the last three shift register units may be configured to receive the reset signal. For simplicity, the trigger signal STV and the reset signal are not shown in FIG. 7.

For example, the gate driving circuit 10 further includes a first voltage line, a second voltage line, a third voltage line, and a fourth voltage line (not shown in the figure). For example, the first voltage line is connected to the first voltage terminal VGL1 and is configured to provide the first voltage; the second voltage line is connected to the second voltage terminal VGL2 and is configured to provide the second voltage; the third voltage line is connected to the third voltage terminal VGH1 and is configured to provide the third voltage; and the fourth voltage line is connected to the fourth voltage terminal VGH2 and is configured to provide the fourth voltage.

For example, as shown in FIG. 7, the gate driving circuit 10 may further include a timing controller 300. For example, the timing controller 300 may be configured to be connected to the first clock signal line CLK1, the second clock signal line CLK2, the third clock signal line CLK3, the fourth clock signal line CLK4, the fifth clock signal line CLK5, and the sixth clock signal line CLK6, so as to provide clock signals to the respective shift register units; and the timing controller 300 may be further configured to be connected to the first voltage line, the second voltage line, the third voltage line, and the fourth voltage line, so as to provide the first voltage to the fourth voltage to the respective shift register units 100, respectively. For example, the timing controller 300 may be further configured to provide the trigger signal STV and the reset signal.

Figure 8A:
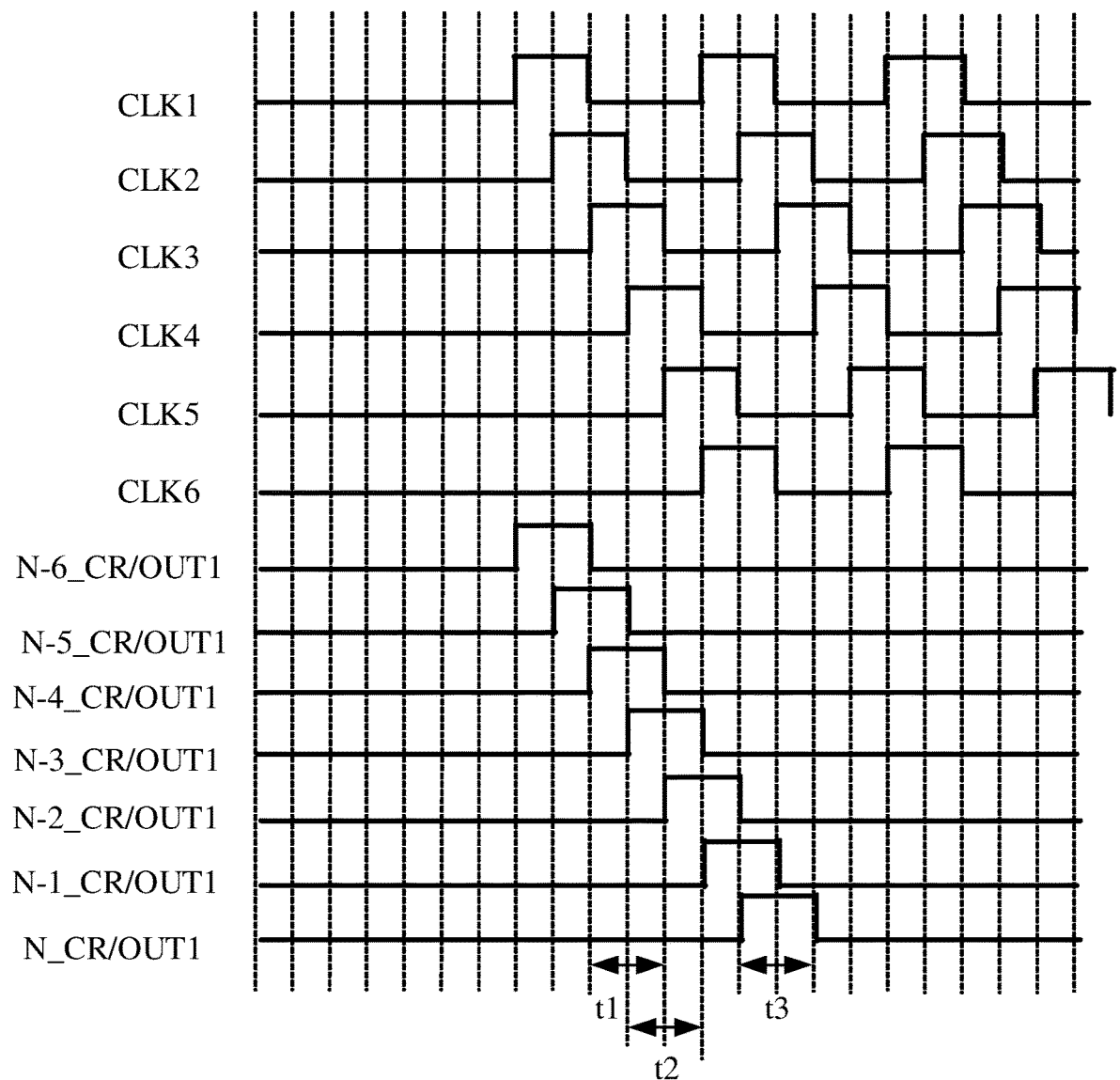
FIG. 8A is a signal timing diagram of an example corresponding to the gate driving circuit as shown in FIG. 7 in operation.
Figure 8B:
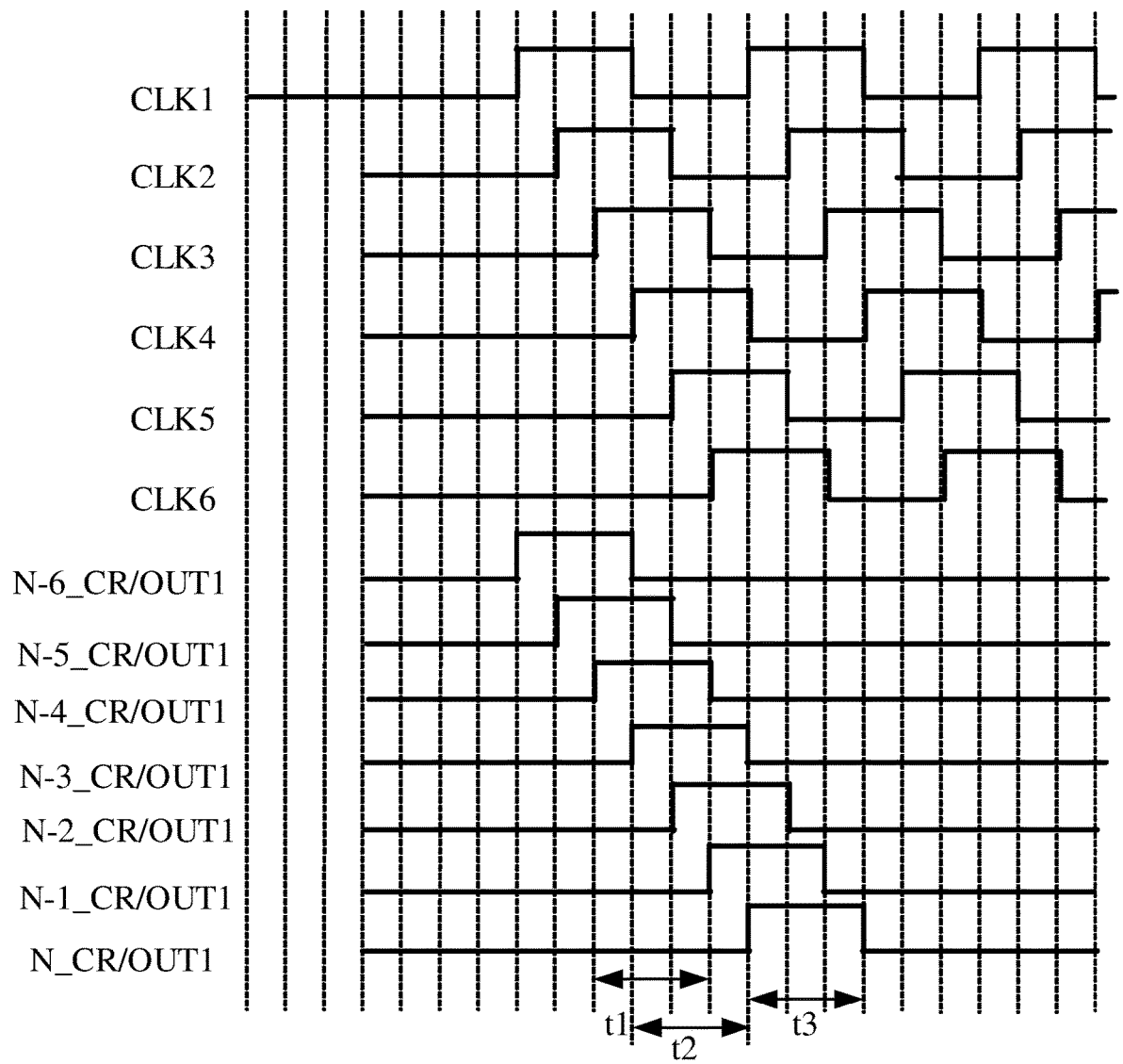
FIG. 8B is a signal timing diagram of another example corresponding to the gate driving circuit as shown in FIG. 7 in operation.

For example, the timing of the clock signals provided on the first clock signal line CLK1, the second clock signal line CLK2, the third clock signal line CLK3, the fourth clock signal line CLK4, the fifth clock signal line CLK5, and the sixth clock signal line CLK6 may use the signal timing as shown in FIG. 8A or FIG. 8B to implement the function of the gate driving circuit 10 outputting the gate scan signals line by line. For example, the duty cycle of the clock signal as shown in FIG. 8A is 40%; the duty cycle of the clock signal as shown in FIG. 8B is 50%. It should be noted that the levels of the potentials in the signal timing diagram as shown in FIG. 8A and FIG. 8B are only schematic, and do not represent real potential values or a relative ratio. Corresponding to the above embodiment of the present disclosure, a high level signal corresponds to a turn-on signal of an N-type transistor, and a low level signal corresponds to a turn-off signal of the N-type transistor.

For example, in some examples, the working principle of the N-th stage of shift register unit of the gate driving circuit 10 as shown in FIG. 7 will be described below with reference to the signal timing diagram as shown in FIG. 8A. For example, the N-th stage of shift register unit may adopt the circuit structure as shown in FIG. 5, and may also adopt the circuit structure as shown in FIG. 6. The working principle of the shift register unit 100 is as follows.

In a first phase t1, the third clock signal line CLK3 provides a high level. Because the clock signal terminal CLK of the (N−4)-th stage of shift register unit is connected to the third clock signal line CLK3, in this phase, the shift output terminal N−4_CR of the (N−4)-th stage of shift register unit outputs a valid output level (e.g., a high level), because the second electrode of the first capacitor of the N-th stage of shift register unit is connected to the shift output terminal N−4_CR of the (N−4)-th stage of shift register unit, and therefore, the second electrode of the first capacitor C1 changes from a low level to a high level, and according to the characteristic that the voltage across two terminals of the capacitor cannot be abruptly changed, so that the voltage of the first electrode (that is, the first node N1) of the first capacitor C1 is to be bootstrap. Therefore, in this phase, the first node N1 is charged to a high level; at the same time, the first clock signal line CLK1 provides a low level. Because the clock signal terminal CLK of the N-th stage of shift register unit is connected to the first clock signal line CLK1, in this phase, the shift output terminal N_CR and the scan signal output terminal N_OUT1 of the N-th stage of shift register unit output low levels.

In the case where the circuit structure in FIG. 6 is adopted, the circuit structure further includes the first transistor T1. In this phase, the gate electrode of the first transistor T1 is also connected to the shift output terminal N−4_CR of the (N−4)-th stage of shift register unit, so the first transistor T1 is turned on in response to a high level output from the shift output terminal N−4_CR of the (N−4)-th stage of shift register unit, so that the first voltage terminal VGL1 is connected to the shift output terminal N_CR and the scan signal output terminal N_OUT1 of the N-th stage of shift register unit, and further, the output terminal of the N-th stage of shift register unit is prevented from outputting a high level in this phase, thereby ensuring the display quality of the display panel.

In a second phase t2, the fourth clock signal line CLK4 provides a high level. Because the clock signal terminal CLK of the (N−3)-th stage of shift register unit is connected to the fourth clock signal line CLK4, therefore, in this phase, the shift output terminal N−3_CR of the (N−3)-th stage of shift register unit outputs a valid output level (for example, a high level). Because the input terminal INT of the N-th stage of shift register unit is connected to the shift output terminal N−3_CR of the (N−3)-th stage of shift register unit, in this phase, the first node N1 of the N-th stage of shift register unit continues to be charged to a high level; at the same time, because the first clock signal line CLK1 provides a low level, in this phase, the shift output terminal N_CR and the scan signal output terminal N_OUT1 of the N-th stage of shift register unit output low levels.

Because before the second phase t2 begins, the first node N1 is precharged in advance in the first phase t1, that is, the effect of the drift of the characteristics (for example, the threshold voltage) of the transistor is compensated in advance, and at the same time, the second node N2 is pulled down (for example, discharged) in advance, so as to avoid the voltage of the first node N1 from leaking through the transistor (e.g., the eleventh transistor T11) connected to the first node N1 after the first node N1 is charged in the second phase t2, thereby improving the charging capacity of the first node N1, thus solving the problem of insufficient charging of the first node (for example, the pull-up node) due to the characteristic drift of the transistor at a high refresh frequency, so that the stability of the circuit structure of the shift register unit is improved, and the service life of the display panel is extended.

In a third phase t3, the first clock signal line CLK1 provides a high level. Because the clock signal terminal CLK of the N-th stage of shift register unit 100 is connected to the first clock signal line CLK1, in this phase, the level of the first node N1 is charged to a second high level, and at the same time, the output circuit 120 of the N-th stage of shift register unit 100 is turned on under the control of the high level of the first node N1, and outputs the high level provided by the first clock signal line CLK1 to the shift output terminal N_CR and the scan signal output terminal N_OUT1 of the N-th stage of shift register unit.

For example, in other examples, the working principle of the N-th stage of shift register unit of the gate driving circuit 10 as shown in FIG. 7 will be described below with reference to the signal timing diagram as shown in FIG. 8B. For example, in this example, the N-th stage of shift register unit may adopt the circuit structure as shown in FIG. 6, but can not adopt the circuit structure shown in FIG. 5. The specific working principle of the shift register unit is as follows.

In a first phase t1, the third clock signal line CLK3 provides a high level. Because the clock signal terminal CLK of the (N−4)-th stage of shift register unit is connected to the third clock signal line CLK3, in this phase, the shift output terminal N−4_CR of the (N−4)-th stage of shift register unit outputs a valid output level (e.g., a high level), because the second electrode of the first capacitor of the N-th stage of shift register unit is connected to the shift output terminal N−4_CR of the (N−4)-th stage of shift register unit, and therefore, the second electrode of the first capacitor C1 changes from a low level to a high level, and according to the characteristic that the voltage across two ends of the capacitor cannot be abruptly changed, so that the voltage of the first electrode (that is, the first node N1) of the first capacitor C1 is to be bootstrap. Therefore, in this phase, the first node N1 is charged to a high level; at the same time, in this phase, the first clock signal line CLK1 provides a part of a high level, the clock signal terminal CLK of the N-th stage of shift register unit is connected to the first clock signal line CLK1, because the gate electrode of the first transistor T1 is also connected to the shift output terminal N−4_CR of the (N−4)-th stage of shift register unit, the first transistor T1 is turned on in response to a high level output from the shift output terminal N−4_CR of the (N−4)-th stage of shift register unit, so that the first voltage terminal VGL1 is connected to the shift output terminal N_CR and the scan signal output terminal N_OUT1 of the N-th stage of shift register unit, thereby preventing the output terminal of the N-th stage of shift register unit from outputting a high level provided by the first clock signal line CLK1 in this phase and ensuring the display quality of the display panel.

In a second phase t2, the fourth clock signal line CLK4 provides a high level. Because the clock signal terminal CLK of the (N−3)-th stage of shift register unit is connected to the fourth clock signal line CLK4, therefore, in this phase, the shift output terminal N−3_CR of the (N−3)-th stage of shift register unit outputs a valid output level (for example, a high level). Because the input terminal INT of the N-th stage of shift register unit is connected to the shift output terminal N−3_CR of the (N−3)-th stage of shift register unit, in this phase, the first node N1 of the N-th stage of shift register unit continues to be charged to a high level; at the same time, because the first clock signal line CLK1 provides a low level, in this phase, the shift output terminal N_CR and the scan signal output terminal N_OUT1 of the N-th stage of shift register unit output low levels.

In a third phase t3, the first clock signal line CLK1 provides a high level. Because the clock signal terminal CLK of the N-th stage of shift register unit 100 is connected to the first clock signal line CLK1, in this phase, the level of the first node N1 is charged to a second high level, and at the same time, the output circuit 120 of the N-th stage of shift register unit 100 is turned on under the control of the high level of the first node N1, and outputs the high level provided by the first clock signal line CLK1 to the shift output terminal N_CR and the scan signal output terminal N_OUT1 of the N-th stage of shift register unit.

It should be noted that the gate driving circuit 10 may further include eight, ten, twelve, or more clock signal lines, and the number of clock signal lines depends on specific situations, and the embodiments of the present disclosure are not limited in this aspect.

It should be noted that in the case where the gate driving circuit 10 provided by the embodiment of the present disclosure is used to drive a display panel, the gate driving circuit 10 may be disposed on one side of the display panel. For example, the display panel includes a plurality of rows of gate lines, and the second output terminals of the shift register units in the gate driving circuit 10 may be configured to be sequentially connected to the plurality of rows of gate lines, to output gate scan signals. It should be noted that the gate driving circuit 10 may also be provided on both sides of the display panel to achieve bilateral driving. The embodiment of the present disclosure does not limit the setting manner of the gate driving circuit 10.

Figure 9:
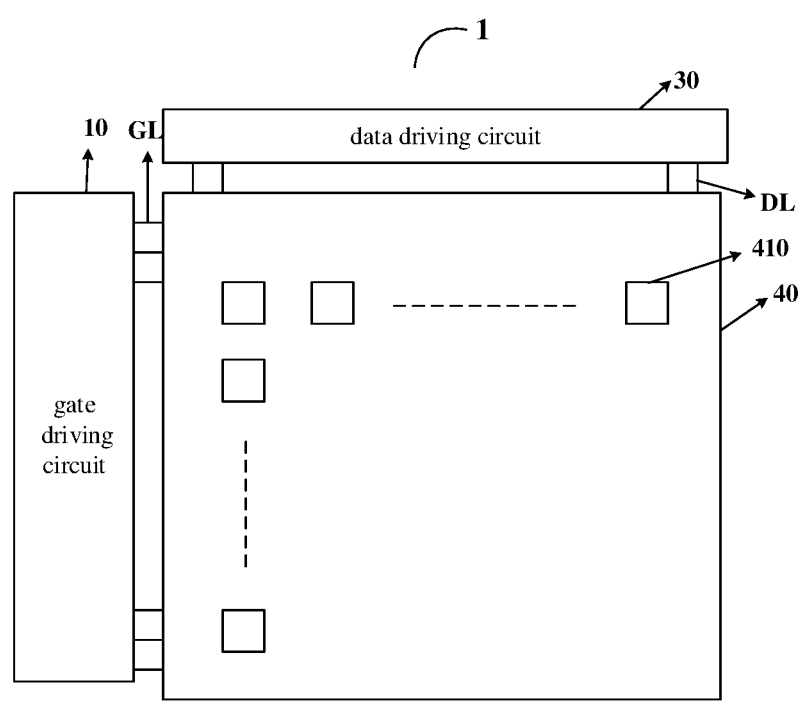
FIG. 9 is a schematic diagram of a display device provided by at least one embodiment of the present disclosure.

At least one embodiment of the present disclosure also provides a display device 1. As shown in FIG. 9, the display device 1 includes a gate driving circuit 10 provided by the above embodiments of the present disclosure. The display device 1 further includes a display panel 40, the display panel 40 includes a plurality of pixel units arranged in a pixel array. For example, the display device 1 may further include a data driving circuit 30. The data driving circuit 30 is used to provide data signals to the pixel array; the gate driving circuit 10 is used to provide driving signals to the pixel array, for example, the driving signals may drive the scan transistors and the sense transistors in the sub-pixel units 410. The data driving circuit 30 is electrically connected to the sub-pixel unit 410 through a data line DL, and the gate driving circuit 10 is electrically connected to the sub-pixel unit 410 through a gate line GL.

It should be noted that the display device 1 in the embodiment may be: a LCD panel, a LCD TV, a monitor, an OLED panel, an OLED TV, an electronic paper display device, a mobile phone, a tablet computer, a notebook computer, a digital photo frame, a navigator, or any product or component having a display function. The display device 1 may further include other conventional components such as a display panel, and the embodiments of the present disclosure are not limited in this aspect.

Technical effect of the display device 1 provided by the embodiments of the present disclosure may be referred to the corresponding descriptions of the gate driving circuit 10 in the foregoing embodiments, and details are not described herein again.

It should be noted that, for clarity and conciseness, the entire structure of the display device 1 is not given. In order to achieve the necessary functions of the display device, those skilled in the art may set other structures not shown according to specific application scenarios, and the embodiments of the present disclosure are not limited thereto.

An embodiment of the present disclosure also provides a driving method, and the driving method may be used to drive the shift register unit 100 provided by the embodiments of the present disclosure. For example, in some examples, the driving method includes the following operations.

In a first phase, the first node control circuit 130 charges the first node N1 in response to the precharge control signal.

In a second phase, the input circuit 110 charges the first node N1 in response to an input signal.

In a third phase, the output circuit 120 outputs the output signal at the output terminal OUT under control of the level signal of the first node N1.

For example, in other examples, the shift register unit 100 includes an output control circuit 140, and the driving method further includes the following operations.

The output control circuit 140 controls the output terminal OUT to be at an invalid output level in response to the precharge control signal.

The technical effects of the driving method for driving the shift register unit 100 provided by the embodiments of the present disclosure may be referred to the corresponding description of the shift register unit 100 in the foregoing embodiment, and details are not described herein.

The following statements should be noted:

(1) The accompanying drawings of the embodiments of the present disclosure involve only the structure(s) in connection with the embodiment(s) of the present disclosure, and other structure(s) can be referred to common design(s).

(2) In case of no conflict, the embodiments of the present disclosure and the features in the embodiment(s) can be combined with each other to obtain new embodiment(s).

What have been described above are only specific implementations of the present disclosure, and are not intended to limit the protection scope of the present disclosure, the protection scope of the present disclosure should be based on the protection scope of the appended claims.

What is claimed is:

1. A shift register unit, comprising an input circuit, an output circuit, a first node control circuit, and an output control circuit,
    wherein the input circuit is configured to charge a first node in response to an input signal;
    the output circuit is configured to output an output signal at an output terminal under control of a level signal of the first node; and
    the first node control circuit is configured to receive a precharge control signal from a precharge control terminal and charge the first node in response to the precharge control signal before the output terminal outputs the output signal,
    the output control circuit is connected to the output terminal and the precharge control terminal, and is configured to receive the precharge control signal from the precharge control terminal and to control the output terminal to be at an invalid output level during a non-output phase in response to the precharge control signal.

2. The shift register unit according to claim 1, wherein the input circuit is connected to the first node, the output circuit comprises the output terminal, and the output circuit is connected to the first node, and the first node control circuit is connected to the first node and the precharge control terminal.

3. The shift register unit according to claim 1, wherein the first node control circuit comprises a first capacitor,
    a first electrode of the first capacitor is connected to the first node, and a second electrode of the first capacitor is connected to the precharge control terminal to receive the precharge control signal.

4. The shift register unit according to claim 1, wherein the output control circuit comprises a first transistor,
    a gate electrode of the first transistor is connected to the precharge control terminal to receive the precharge control signal, a first electrode of the first transistor is connected to the output terminal, and a second electrode of the first transistor is connected to a first voltage terminal to receive a first voltage.

5. The shift register unit according to claim 1, further comprising a first node reset circuit,
    wherein the first node reset circuit is connected to the first node and configured to reset the first node in response to a reset signal.

6. The shift register unit according to claim 1, further comprising a second node control circuit, a first node noise reduction circuit, and an output noise reduction circuit,
    wherein the second node control circuit is connected to the first node and a second node, and is configured to control a level of the second node under control of the level signal of the first node;
    the first node noise reduction circuit is connected to the first node and the second node, and is configured to perform noise reduction on the first node under control of a level signal of the second node; and
    the output noise reduction circuit is connected to the second node and the output terminal, and is configured to perform noise reduction on the output terminal under control of the level signal of the second node.

7. The shift register unit according to claim 1, wherein the output terminal comprises a shift output terminal and at least one scan signal output terminal.

8. The shift register unit according to claim 7, wherein the at least one scan signal output terminal comprises one scan signal output terminal, the output circuit comprises a second transistor, a third transistor, and a second capacitor;
    a gate electrode of the second transistor is connected to the first node, a first electrode of the second transistor is connected to a clock signal terminal to receive a clock signal, a second electrode of the second transistor is connected to the shift output terminal;
    a gate electrode of the third transistor is connected to the first node, a first electrode of the third transistor is connected to the clock signal terminal to receive the clock signal, and a second electrode of the third transistor is connected to the scan signal output terminal;
    a first electrode of the second capacitor is connected to the first node, and a second electrode of the second capacitor is connected to the scan signal output terminal or the shift output terminal; and
    the clock signal is transmitted to the output terminal and serves as the output signal.

9. The shift register unit according to claim 1, further comprising: a first node reset circuit, a total reset circuit, a second node control circuit, a first node noise reduction circuit, and an output noise reduction circuit;
    wherein the first node reset circuit is connected to the first node and is configured to reset the first node in response to a reset signal;
    the total reset circuit is connected to the first node and is configured to reset the first node in response to a total reset signal;
    the second node control circuit is connected to the first node, a second node, and a third node, and is configured to control a level of the second node and a level of the third node under control of the level signal of the first node;
    the first node noise reduction circuit is connected to the first node and the second node, and is configured to perform noise reduction on the first node under control of a level signal of the second node;
    the output noise reduction circuit is connected to the second node and the output terminal, and is configured to perform noise reduction on the output terminal under control of the level signal of the second node;
    the first node control circuit comprises:
    a first capacitor, wherein a first electrode of the first capacitor is connected to the first node, and a second electrode of the first capacitor is connected to the precharge control terminal to receive the precharge control signal;
    the output control circuit comprises:
    a first transistor, wherein a gate electrode of the first transistor is connected to the precharge control terminal to receive the precharge control signal, a first electrode of the first transistor is connected to the output terminal, and a second electrode of the first transistor is connected to a first voltage terminal to receive a first voltage;

in a case where the output terminal comprises a shift output terminal and one scan signal output terminal, the output circuit comprises a second transistor, a third transistor, and a second capacitor, a gate electrode of the second transistor is connected to the first node, a first electrode of the second transistor is connected to a clock signal terminal to receive a clock signal, a second electrode of the second transistor is connected to the shift output terminal;

a gate electrode of the third transistor is connected to the first node, a first electrode of the third transistor is connected to the clock signal terminal to receive the clock signal, and a second electrode of the third transistor is connected to the scan signal output terminal;

a first electrode of the second capacitor is connected to the first node, and a second electrode of the second capacitor is connected to the scan signal output terminal or the shift output terminal;

the clock signal is transmitted to the output terminal and serves as the output signal, the input circuit comprises:

a fourth transistor, wherein a gate electrode and a first electrode of the fourth transistor are electrically connected to each other, and are configured to be both connected to an input terminal to receive the input signal, and a second electrode of the fourth transistor is configured to be connected to the first node;

the first node reset circuit comprises:

a fifth transistor, wherein a gate electrode of the fifth transistor is configured to be connected to a reset terminal to receive the reset signal, a first electrode of the fifth transistor is connected to the first node, and a second electrode of the fifth transistor is connected to a second voltage terminal to receive a second voltage;

the total reset circuit comprises:

a sixth transistor, wherein a gate electrode of the sixth transistor is connected to a total reset terminal to receive the total reset signal, a first electrode of the sixth transistor is connected to the first node, and a second electrode of the sixth transistor is connected to the second voltage terminal to receive the second voltage;

the second node control circuit comprises a seventh transistor, an eighth transistor, a ninth transistor, a tenth transistor, a twenty-seventh transistor, a twenty-eighth transistor, a twenty-ninth transistor, and a twentieth transistor, a gate electrode of the seventh transistor is connected to a first control node, a first electrode of the seventh transistor is connected to a third voltage terminal to receive a third voltage, and a second electrode of the seventh transistor is connected to the second node;

a gate electrode of the eighth transistor is connected to the first node, a first electrode of the eighth transistor is connected to the second node, and a second electrode of the eighth transistor is connected to the second voltage terminal to receive the second voltage;

a gate electrode of the ninth transistor and a first electrode of the ninth transistor are electrically connected to each other, and are configured to be both connected to the third voltage terminal to receive the third voltage, and a second electrode of the ninth transistor is connected to the first control node;

a gate electrode of the tenth transistor is connected to the first node, a first electrode of the tenth transistor is connected to the first control node, and a second electrode of the tenth transistor is connected to the second voltage terminal to receive the second voltage;

a gate electrode of the twenty-seventh transistor is connected to a second control node, a first electrode of the twenty-seventh transistor is connected to a fourth voltage terminal to receive a fourth voltage, and a second electrode of the twenty-seventh transistor is connected to the third node;

a gate electrode of the twenty-eighth transistor is connected to the first node, a first electrode of the twenty-eighth transistor is connected to the third node, and a second electrode of the twenty-eighth transistor is connected to the second voltage terminal to receive the second voltage;

a gate electrode of the twenty-ninth transistor and a first electrode of the twenty-ninth transistor are electrically connected to each other, and are configured to be both connected to the fourth voltage terminal to receive the fourth voltage, and a second electrode of the twenty-ninth transistor is connected to the second control node;

a gate electrode of the twentieth transistor is connected to the first node, a first electrode of the twentieth transistor is connected to the second control node, and a second electrode of the twentieth transistor is connected to the second voltage terminal to receive the second voltage;

the first node noise reduction circuit comprises an eleventh transistor and a twenty-first transistor, a gate electrode of the eleventh transistor is connected to the second node, a first electrode of the eleventh transistor is connected to the first node, and a second electrode of the eleventh transistor is connected to the second voltage terminal to receive the second voltage;

a gate electrode of the twenty-first transistor is connected to the third node, a first electrode of the twenty-first transistor is connected to the first node, and a second electrode of the twenty-first transistor is connected to the second voltage terminal to receive the second voltage;

the output noise reduction circuit is implemented as a twelfth transistor, a twenty-second transistor, a thirteenth transistor, and a twenty-third transistor, a gate electrode of the twelfth transistor is connected to the second node, a first electrode of the twelfth transistor is connected to the shift output terminal, and a second electrode of the twelfth transistor is connected to the second voltage terminal to receive the second voltage;

a gate electrode of the twenty-second transistor is connected to the third node, a first electrode of the twenty-second transistor is connected to the shift output terminal, and a second electrode of the twenty-second transistor is connected to the second voltage terminal to receive the second voltage;

a gate electrode of the thirteenth transistor is connected to the second node, a first electrode of the thirteenth transistor is connected to the scan signal output terminal, and a second electrode of the thirteenth transistor is connected to the first voltage terminal to receive the first voltage; and a gate electrode of the twenty-third transistor is connected to the third node, a first electrode of the twenty-third transistor is connected to the scan signal output terminal, and a second electrode of the twenty-third transistor is connected to the first voltage terminal to receive the first voltage.

10. A gate driving circuit, comprising a plurality of cascaded shift register units according to claim 1.

11. The gate driving circuit according to claim 10, wherein
except for first to m-th stages of shift register units, a precharge control terminal of a remaining stage of shift register unit is connected to an output terminal of an upper stage of shift register unit that is separated by at least m stages from the remaining stage of shift register;
except for the first to m-th stages of shift register units, an input terminal of the remaining stage of shift register unit is connected to an output terminal of an upper stage of shift register unit that is separated by (m−1) stages from the remaining stage of shift register; and
except for last m-stage of shift register units, a reset terminal of the remaining stage of shift register unit is connected to an output terminal of a lower stage of shift register unit that is separated by (m−1) stages from the remaining stage of shift register,
wherein m is an integer greater than two.

12. A display device, comprising the gate driving circuit according to claim 10.

13. A driving method of the shift register unit according to claim 1, comprising:
in a first phase, by the first node control circuit, charging the first node in response to the precharge control signal;
in a second phase, by the input circuit, charging the first node in response to an input signal; and
in a third phase, by the output circuit, outputting the output signal at the output terminal under control of the level signal of the first node.

14. The driving method according to claim 13, wherein the first phase of the driving method further comprises:
by the output control circuit, controlling the output terminal to be at the invalid output level in response to the precharge control signal.

15. The shift register unit according to claim 1, wherein the input circuit comprises a fourth transistor, a gate electrode and a first electrode of the fourth transistor are electrically connected to each other, and are configured to be both connected to an input terminal to receive the input signal, and a second electrode of the fourth transistor is configured to be connected to the first node.

* * * * *